(12) United States Patent
Macionczyk et al.

(10) Patent No.: US 12,404,581 B2
(45) Date of Patent: Sep. 2, 2025

(54) APPARATUS FOR ACCOMMODATING AN ARTICLE IN A VACUUM-COATING INSTALLATION

(71) Applicant: Carl Zeiss Vision International GmbH, Aalen (DE)

(72) Inventors: Frank Macionczyk, Oberkochen (DE); Erwin Green, Aalen (DE)

(73) Assignee: Carl Zeiss Vision International GmbH, Aalen (DE)

( * ) Notice: Subject to any disclaimer, the term of this patent is extended or adjusted under 35 U.S.C. 154(b) by 0 days.

(21) Appl. No.: 18/151,031

(22) Filed: Jan. 6, 2023

(65) Prior Publication Data

US 2023/0151478 A1 May 18, 2023

Related U.S. Application Data

(63) Continuation-in-part of application No. PCT/EP2021/068190, filed on Jul. 1, 2021.

(30) Foreign Application Priority Data

Jul. 13, 2020 (DE) ..................... 10 2020 118 367.4

(51) Int. Cl.
*C23C 14/50* (2006.01)
*C23C 14/24* (2006.01)
(Continued)

(52) U.S. Cl.
CPC ............ *C23C 14/505* (2013.01); *C23C 14/24* (2013.01); *C23C 14/54* (2013.01); *H01J 37/32715* (2013.01); *H01J 37/3411* (2013.01)

(58) Field of Classification Search
CPC .... C23C 14/50; C23C 14/505; H01J 37/3411; H01J 37/32715
See application file for complete search history.

(56) References Cited

U.S. PATENT DOCUMENTS

| | | | |
|---|---|---|---|
| 5,124,019 A | 6/1992 | Kunkel et al. | |
| 5,683,561 A * | 11/1997 | Hollars | ................. C23C 14/568 |
| | | | 204/298.25 |

(Continued)

FOREIGN PATENT DOCUMENTS

| | | |
|---|---|---|
| CN | 101512039 A | 8/2009 |
| CN | 107829069 A | 3/2018 |

(Continued)

OTHER PUBLICATIONS

International Search Report issued in PCT/EP2021/068190, to which this application claims priority, mailed Oct. 26, 2021, and English-language translation thereof.

(Continued)

*Primary Examiner* — John J Brayton
(74) *Attorney, Agent, or Firm* — Tautz & Schuhmacher LLC; Georg Hasselmann (57) ABSTRACT

An apparatus for accommodating an article in a vacuum-coating installation has a carrier with a coating opening and a retaining device for retaining the article in the coating opening. The retaining device has a pivot bearing that is secured on the carrier and a pivot axis, about which it is possible to pivot the retaining device to thereby turn the article in the coating opening. The pivot bearing has a bearing body with a circumferentially closed mount for a round body, which extends in the direction of the pivot axis, wherein the bearing body has a circumferentially closed mount and a circumferentially open mount for the round body, and therefore, when the retaining device is arranged on the carrier, the round body can be introduced through the circumferentially open mount into the circumferentially closed mount.

13 Claims, 6 Drawing Sheets

(51) Int. Cl.
   *C23C 14/54*     (2006.01)
   *H01J 37/32*     (2006.01)
   *H01J 37/34*     (2006.01)

(56) References Cited

U.S. PATENT DOCUMENTS

| | | | |
|---|---|---|---|
| 8,356,808 B2 | 1/2013 | Macionczyk | |
| 2009/0206535 A1* | 8/2009 | Macionczyk | B29D 11/00865 29/559 |
| 2015/0125597 A1* | 5/2015 | Nagai | C23C 14/568 427/127 |
| 2019/0376176 A1 | 12/2019 | Moreni et al. | |

FOREIGN PATENT DOCUMENTS

| | | | |
|---|---|---|---|
| CN | 108624437 A | 10/2018 | |
| DE | 69200590 T2 | 12/1994 | |
| DE | 102006041137 A1 | 3/2008 | |
| EP | 385157 A1 | 9/1990 | |
| EP | 406484 A1 | 1/1991 | |
| EP | 497651 A1 | 8/1992 | |
| JP | 3044606 B2 | 5/2000 | |
| WO | 2015186702 A1 | 12/2015 | |

OTHER PUBLICATIONS

Written opinion issued in PCT/EP2021/068190, to which this application claims priority, mailed Oct. 26, 2021.
International Preliminary Examination Report issued in PCT/EP2021/068190, to which this application claims priority, completed Sep. 28, 2022, and English-language translation thereof.
Office Action by the Chinese Patent Office (SIPO) issued in CN202180049150.X, which is a counterpart of hereof, mailed on Mar. 28, 2024, and English-language translation thereof.
Notice of Reasons for Refusal, issued in JP2023501824 which is a counterpart hereof, issued Jul. 6, 2023 and English-language translation thereof.
Office Action by the Chinese Patent Office (SIPO) issued in CN202180049150.X, which is a counterpart hereof, issued Sep. 28, 2023, and English-language translation thereof.
Intention to grant a patent, issued in JP2023501824 which is a counterpart hereof, issued Oct. 24, 2023 and Enlgish-language translation thereof.
Intention to grant a patent, issued in EP21746336.3 which is a counterpart hereof, mailed Dec. 5, 2023.

\* cited by examiner

APPARATUS FOR ACCOMMODATING AN ARTICLE IN A VACUUM-COATING INSTALLATION

CROSS REFERENCE TO RELATED APPLICATIONS

This application is a continuation-in-part application of international patent application PCT/EP2021/068190, filed Jul. 1, 2021, designating the United States and claiming priority from German patent application DE 10 2020 118 367.4, filed Jul. 13, 2020, both of which are hereby incorporated by reference in their entireties.

TECHNICAL FIELD

The disclosure relates to an apparatus for receiving an object in a vacuum coating installation, comprising a carrier which has a coating opening, comprising a holding device for holding the object in the coating opening, and comprising a pivot bearing for the holding device, which pivot bearing is secured to the carrier, has a pivot axis about which the holding device can be pivoted for turning the object that it holds in the coating opening, and has a bearing body with a circumferentially closed receptacle for a round body with an extent in the direction of the pivot axis. The disclosure moreover relates to a method for arranging a holding device, comprising an object secured therein, on the carrier of the apparatus, to a handling apparatus therefor, and to a computer program product.

BACKGROUND

To provide spectacle lenses with an antireflective coating, thin optical layers are applied to the lens element surfaces. The antireflective coatings are produced in vacuum coating installations. In vacuum coating installations, optically active materials in a high vacuum can be evaporated from an evaporator source or sputtered from a sputtering source and deposited on the spectacle lenses.

DE 10 2006 041 137 A1 discloses an apparatus of the type mentioned in the introduction. This apparatus has a carrier, which can be moved about a vertical axis of rotation in a vacuum chamber of a vacuum coating installation. The carrier comprises a body with a spherical cap, on which a multiplicity of holding devices, with objects that are to be coated secured therein, are received in pivot bearings, which can be turned in a coating opening by means of magnetic force.

This has the effect that two opposite surfaces of objects can be coated in the apparatus in a vacuum without it being necessary to vent the vacuum chamber after the first coating operation to turn objects, as a result of which an overall process time can be considerably reduced.

The holding devices known from DE 10 2006 041 137 A1 each have mounting pins, which must be inserted into a receptacle in a bearing body of the pivot bearing when a holding device is being arranged on the carrier. In order to be able to insert the mounting pins easily into the receptacle of a bearing body, the receptacle has an oversize in relation to the mounting pin. Careless work when holding devices are being arranged on the carrier can have the consequence here that a holding device is held in the pivot bearings only by one of two mounting pins. In that case, such a holding device, comprising the object secured therein, can no longer be turned in a vacuum coating installation. Furthermore, there is the risk in this case that a holding device comes out of a receptacle in a pivot bearing independently and then damages other objects arranged on the carrier for the coating operation.

SUMMARY

It is an object of the disclosure to specify an apparatus for receiving an object in a vacuum coating installation, which apparatus ensures that the object is securely held during the coating operation and makes it possible to arrange an object to be coated on a carrier with simple movements such that it can turn in the vacuum coating installation.

This object is achieved by an apparatus for receiving an object in a vacuum-coating installation, a method for arranging a holding device, a method for improving a finish of an object in a vacuum coating installation, a handling apparatus for arranging a holding device, and a computer program product for carrying out a method for improving a finish of an object in a vacuum coating installation as disclosed herein. Exemplary embodiments of the disclosure are discussed below.

An apparatus according to the disclosure for receiving an object in a vacuum coating installation, comprises a carrier which has a coating opening, comprises a holding device for holding the object in the coating opening, and comprises a pivot bearing for the holding device, which pivot bearing is secured to the carrier, has a pivot axis about which the holding device can be pivoted for turning the object that it holds in the coating opening, and has a bearing body with a circumferentially closed receptacle for a round body with an extent in the direction of the pivot axis, and which additionally has a circumferentially open receptacle for the round body, with the result that the round body can be inserted into the circumferentially closed receptacle through the circumferentially open receptacle when the holding device is being arranged on the carrier.

In the present case, a vacuum coating installation is understood to mean an installation with which objects can be coated under vacuum conditions, in particular high-vacuum conditions. Vacuum coating installations are, for example, cathode atomization installations, also referred to as sputtering installations, vapor deposition installations or chemical vapor deposition installations.

An object to be received in an apparatus according to the disclosure is in particular an optical element. In this context, an optical element is understood to mean an everyday object which has a function of absorbing, transmitting, reflecting, refracting or scattering electromagnetic radiation, such as e.g., visible light, UV or IR radiation. In the present case, optical elements are understood to mean e.g., lens elements, for example spectacle lens elements or contact lens elements, but also planar and round optical units, prisms, mirrors, spherical or aspherical lenses, edged spectacle lenses or elliptical lenses, etc. An object to be received in an apparatus according to the disclosure, however, may also be a tool such as a drill or a milling head.

In the present case, a circumferentially closed receptacle denotes a receptacle for a body, e.g., a mounting pin, which, after the body has been inserted into the receptacle, completely encloses the body with respect to the cross-sectional plane orthogonally to the insertion direction.

In the present case, a circumferentially open receptacle denotes a receptacle for a body, e.g., a mounting pin, which, after the body has been inserted into the receptacle, only partially encloses the body with respect to the cross-sectional plane orthogonally to the insertion direction. With particularity, partially means that the circumferentially open receptacle encloses at least half, further typically at least three quarters, of the body.

The circumferentially closed receptacle of the bearing body may merge with the circumferentially open receptacle of the bearing body or be spaced apart therefrom.

It is advantageous when the circumferentially open receptacle of the bearing body faces the coating opening of the carrier and when the extent of the circumferentially open receptacle of the bearing body in the direction of the pivot axis amounts to at least 50% and at most 100% of the distance between the circumferentially closed receptacle of the bearing body and the coating opening. This measure ensures that the holding device, comprising the object, can be placed in the coating opening and turned there, and that the circumferentially open receptacle of the bearing body is large enough to prevent the round body from moving out of the bearing body.

An exemplary embodiment provides that the circumferentially open receptacle of the bearing body has an opening arranged on a side of the bearing body that faces away from the carrier. It is particularly typical in this case for the opening to be arranged in the circumferentially open receptacle in such a way that it allows displacement of the round body in two spatial directions, specifically in the direction of the pivot axis and in a direction approximately orthogonal to the surface of the carrier. This has the advantage that the likelihood of the round body moving out of the pivot bearing is minimized.

The circumferentially open receptacle of the bearing body particularly typically has a U-shape in this case. Advantageously, the semicircle of the U-shape has the same radius as the circumferentially closed receptacle of the bearing body. The sides of the circumferentially open receptacle of the bearing body that face the body to be received further advantageously lie in the tangential planes of the sides of the circumferentially closed receptacle that face the body to be received. These measures have the advantage that, if the round body falls out of the circumferentially closed receptacle into the circumferentially open receptacle, further displacement of the round body toward the opening of the circumferentially open receptacle is restricted. In addition, the walls, surrounding the round body, of the circumferentially open receptacle ensure that the round body is guided back into the circumferentially closed receptacle again. In particular, it is useful for this if the circumferentially closed receptacle of the bearing body is located underneath the circumferentially open receptacle of the bearing body. This is because, in this case, the inherent weight of the round body or of the holding device and/or the movement of the carrier, e.g., a rotation of the carrier, during the coating operation causes the round body to move back into the circumferentially closed receptacle of the bearing body. In this way, the holding device is mounted particularly securely in the bearing body.

The round body may be a mounting pin attached to the holding device. In this case, the mounting pin is inserted into the receptacle of the bearing body in order to hold the holding device, comprising the object, on the carrier.

It is furthermore advantageous when the circumferentially closed receptacle has an oversize in relation to the round body. This oversize allows the round body to move in the bearing body, e.g., by rotation or displacement. The diameter of the circumferentially closed receptacle of the bearing body typically corresponds to between 101% and 150%, particularly typically between 110% and 140%, very particularly typically between 120% and 130%, of the diameter of the round body. This oversize has the advantage that the round body can move in the bearing body, but at the same time the angle of the pivot axis can only change slightly when the holding device is turning.

An exemplary embodiment provides a further pivot bearing for mounting the holding device on the carrier so as to be able to pivot about a pivot axis, which further pivot bearing serves for turning the object held by the holding device in the coating opening and has a further bearing body with a circumferentially closed receptacle for a further round body with an extent in the direction of the pivot axis. The further round body may be inserted into the further pivot bearing and the round body may be inserted into the pivot bearing, so that the holding device can be turned in the coating opening.

Advantageously, in this respect the pivot bearing is located underneath the further pivot bearing, since this facilitates the insertion of the round body into the pivot bearing and of the further round body into the further pivot bearing. Specifically, the further round body can first of all be inserted into the circumferentially closed receptacle of the further bearing body of the further pivot bearing, and then the round body can slide through the circumferentially open receptacle of the bearing body of the pivot bearing into the circumferentially closed receptacle of the bearing body of the pivot bearing.

Here, the further bearing body can likewise have a circumferentially open receptacle, for the further round body, which merges with the circumferentially closed receptacle and through which the further round body can be inserted into the circumferentially closed receptacle when the holding device is being arranged on the carrier. This measure facilitates the insertion of the further round body into the further bearing body of the further pivot bearing.

The arrangement of the circumferentially open receptacle for the round body on the carrier has the technical effect here that, when the round body is moving out of the circumferentially closed receptacle of the bearing body, the round body is guided by the circumferentially open receptacle of the bearing body in such a way that it moves back into the circumferentially closed receptacle again e.g., as a result of its own inherent weight or the inherent weight of the holding device or as a result of the movement of the carrier during the coating operation.

In addition, the circumferentially open receptacle facilitates the insertion of the round body into the circumferentially closed receptacle of the bearing body. In order to insert the round body into the circumferentially closed receptacle of the bearing body, specifically it does not need to be correctly guided in all three spatial directions. Instead, the round body can be inserted into the circumferentially open receptacle and from there into the circumferentially closed receptacle. If the holding device is mounted on the carrier in such a way that the holding device forms a large enough angle with the horizontal plane, the round body can also move into the circumferentially closed receptacle independently after being inserted into the circumferentially open receptacle of the bearing body.

One concept of the disclosure is that this facilitated way of inserting the round body into the circumferentially closed receptacle of the bearing body enables automatic insertion, carried out by a control unit with a computer unit and a computer program, of the round body into the circumferentially closed receptacle of the bearing body. This in particular saves time during the coating operation.

It is advantageous when the further bearing body is secured to the carrier, since this makes it possible to securely hold the holding device on the carrier during the coating operation.

The further round body may likewise be in the form of a mounting pin attached to the holding device.

An apparatus specified above for receiving an object in a vacuum coating installation makes it possible to avoid losses owing to damage to the objects, e.g., damage to lenses. Moreover, the operation of inserting the holding device into the pivot beating is facilitated and therefore the time needed for it is shorter. In addition, the pivot bearing according to the disclosure can be used for an automatic insertion method, which leads to savings on time and workforce for manually handling the objects.

It is advantageous when the bearing body is secured to the carrier. This enables stable mounting of the holding device on the carrier.

An end-face stop for the mounting pin is typically formed in the bearing body. This prevents the mounting pin from moving out of the bearing body in the direction of the circumferentially closed receptacle. To that end, the end-face stop closes off at least part of the circumferentially closed receptacle of the bearing body on the side facing away from the circumferentially open receptacle. Advantageously, the end-face stop closes off only part of the circumferentially closed receptacle, in particular the top part, since this makes it possible for dirt to exit through the bottom part of the circumferentially closed receptacle.

The pivot bearing and the further pivot bearing for mounting the holding device on the carrier so as to be able to pivot about a pivot axis lie on a meridian of a spherical cap. This has the advantage that the holding device is held in the pivot bearing by virtue of its own inherent weight and, as a result, movement of the round body out of the pivot bearing is avoided.

It is advantageous when the holding device is arranged in the pivot bearing and in the further pivot bearing so as to be displaceable in the direction of the pivot axis. This facilitates the insertion of the holding device into the pivot bearing and the further pivot bearing.

Advantageously, the bearing body of the pivot bearing is produced from a solid material, i.e., the bearing body is produced from one piece of material. This has the advantage that the bearing body is particularly stable. As an alternative, the bearing body of the pivot bearing has a first bearing body portion body, which is produced from a solid material and in which the circumferentially closed receptacle is formed, and a further bearing body portion body, which is produced from a solid material and in which the circumferentially open receptacle is formed. In this respect, the further bearing body portion body is attached to a joining surface of the first bearing body portion body or is spaced apart from the first bearing body portion body. This has the advantage that an already existing first bearing body portion body having a circumferentially closed opening can be widened by a further bearing body portion body.

The surfaces of the first bearing body portion body that face the round body to be received define here, with the circumferentially closed receptacle and the circumferentially open receptacle of the further bearing portion body, as far as possible a surface which is continuously differentiable. This measure ensures that, when the round body is sliding out of the circumferentially closed receptacle into the circumferentially open receptacle, it can independently slide back into the circumferentially closed receptacle again. On the other hand, an offset of the two surfaces would lead to tilting of the corresponding round body, so that it then can no longer slide back into the circumferentially closed receptacle.

The holding device for holding the object in the coating opening is turned in the coating opening by means of the pivot bearing for mounting the holding device on the carrier so as to be pivotable about a pivot axis. To that end, e.g., a magnetic force can be generated for the purpose of rotation of the holding device about the pivot axis, which is transferred to the holding device and turns the holding device. Such a method for turning the holding device in the coating opening is described in DE 10 2006 041 137 A1, to which reference is made herewith and the disclosure of which is incorporated in full in the present description of the disclosure. In this context, the spherical cap typically consists of non-magnetic stainless steel. The holding device and/or the object further typically consist of magnetic stainless steel.

The disclosure also relates to a method for arranging a holding device, comprising an object secured therein, for the purpose of being coated in a vacuum coating installation, on a carrier having a coating opening and having a bearing body, which is secured to the carrier or the holding device and has a circumferentially closed receptacle for a round body that has an extent in the direction of a pivot axis and is secured to the holding device or to the carrier, wherein the bearing body additionally has a circumferentially open receptacle for the round body, and in which method, by relatively displacing the holding device with respect to the carrier, the round body is inserted into the circumferentially open receptacle and thereafter moved into the circumferentially closed receptacle. This way of arranging the holding device is particularly easy and time-saving. In comparison to the circumferentially closed receptacle, the circumferentially open receptacle has a larger opening and thus makes it possible to insert the holding device into the circumferentially open receptacle from a greater number of directions—specifically from the direction of the pivot axis, from the direction of the opening of the circumferentially open receptacle, and from all directions in between. This also enables automatic insertion of the holding device, since the circumferentially open receptacle of the bearing body no longer needs to be controlled in three spatial dimensions. Instead, the round body attached to the holding device can be inserted through the opening of the circumferentially open receptacle into the bearing body until it rests against that wall of the circumferentially open receptacle that faces the body to be received, and then, by virtue of the inherent weight of the holding device, can slide into the circumferentially closed receptacle until it touches the end-face stop of the bearing body.

The method for arranging a holding device may be part of a method for improving the finish of an object in a vacuum coating installation, which method has the following method steps: The object is secured in a holding device. The holding device, comprising the object secured therein, for the purpose of being coated in a vacuum coating installation, is arranged on a carrier having a coating opening and having a bearing body, which is secured to the carrier or the holding device and has a circumferentially closed receptacle for a round body that has an extent in the direction of a pivot axis and is secured to the holding device or to the carrier, by the method described above for arranging a holding device. In this respect, the bearing body additionally has a circumferentially open receptacle for the round body. Lastly, the object is coated in the vacuum coating installation.

The disclosure furthermore relates to a handling apparatus having a control unit and having a computer unit, which serves to carry out the method specified above for arranging a holding device, comprising an object secured therein, for the purpose of being coated in a vacuum coating installation, on a carrier. The computer unit contains a computer program having program code which generates control commands for the control unit. The control unit serves to actuate a gripping tool of the handling apparatus, which inserts the holding device, comprising the object secured therein, into the circumferentially open receptacle of the pivot bearing, e.g., in the direction of the opening of the circumferentially open receptacle, until the round body attached to the holding device lies against that wall of the circumferentially open receptacle that faces the body to be received. If the pivot bearing is oriented in such a way that the circumferentially closed receptacle is deeper than the circumferentially open one, the gripping tool releases the holding device, and the holding device comprising the round body slides automatically from the circumferentially open receptacle into the circumferentially closed receptacle of the bearing body owing to its own inherent weight and gravitational force. If the circumferentially closed receptacle is not deeper than the circumferentially open receptacle, after the holding device comprising the round body has been inserted the handling apparatus can displace the holding device into the circumferentially closed receptacle. The circumferentially open receptacle simplifies the automatic insertion here.

If a further pivot bearing with a circumferentially closed receptacle is also secured to the carrier, the handling apparatus guides the holding device comprising the round body and the further round body into the pivot bearing and the further pivot bearing in such a way that, first of all, the further round body is inserted into the circumferentially closed opening of the further pivot bearing and then, as described above, the round body is inserted into the pivot bearing.

The disclosure moreover relates to a computer program product comprising a computer program having program code for carrying out all the method steps of the method specified above for arranging a holding device, when the computer program is loaded on the computer unit of the handling apparatus specified above and/or executed on the computer unit.

Exemplary embodiments of the disclosure are schematically represented in the drawings and described below.

BRIEF DESCRIPTION OF THE DRAWINGS

The disclosure will now be described with reference to the drawings wherein.

DESCRIPTION OF EXEMPLARY EMBODIMENTS

Figure 1:
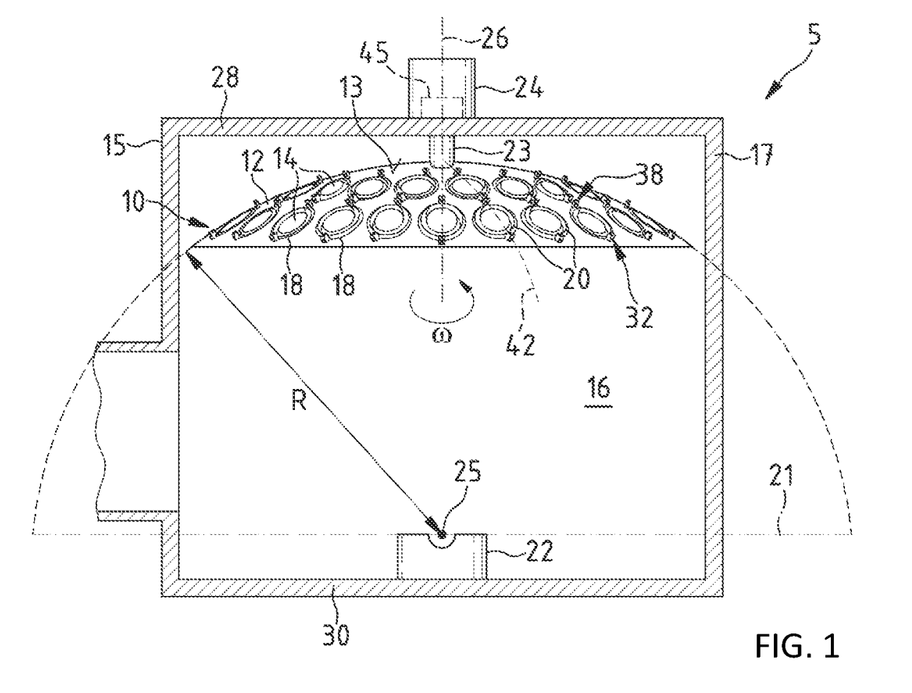
FIG. 1 shows a vacuum coating installation having an apparatus for receiving objects.

FIG. 1 is a section through a vacuum coating installation 5 comprising an apparatus 10 for receiving objects 14, which in the present case are in the form of spectacle lens elements. The vacuum coating installation 5 serves for coating the objects 14 received in the apparatus 10 with an optically active layer. To that end, the vacuum coating installation 5 contains a vacuum chamber 16, in which a material for evaporation can be evaporated in a vacuum by means of an evaporator 22 arranged in the vacuum chamber.

For coating objects received in the apparatus 10, material for evaporation arranged in the evaporator 22 is evaporated by virtue of being heated by an electric heater (not illustrated). It should be noted that, as an alternative to this, the vacuum coating installation 5 may contain in particular an evaporator in which the material for evaporation is evaporated by means of an electron beam.

The vacuum coating installation 5 has a housing 15 comprising a wall 17, a floor 30 and a cover 28, on which the apparatus 10 is held by way of a shaft body 23 in a rotary bearing 45 secured in the cover 28. The apparatus 10 has a carrier 12, which is attached to the shaft body 23 and comprises a body having a spherical cap 13. Coating openings 18, at which a spectacle lens element in the form of an object 14 to be coated can be held by means of a holding device 20, are formed in the body of the carrier 12. In the vacuum coating installation 5, there is a drive module 24 for the shaft body 23. By means of the drive module 24, the shaft body 23 can be moved at a settable angular speed w about a vertical axis of rotation 26. The axis of rotation 26 of the shaft body 23 passes through a spherical cap center 25 of the spherical cap 13 in the vacuum coating installation 5. This spherical cap center 25 is arranged underneath the carrier 12 on the evaporator 22 at a perpendicular distance, corresponding to the spherical cap radius R, from the spherical cap 13 of the carrier 12 in the vacuum chamber 16. The coating openings 18 in the body of the carrier 12 have a circular edge on the spherical cap 13.

To hold the objects 14 to be coated in the coating openings 18 of the carrier 12, the apparatus 10 has a multiplicity of holding devices 20 for the purpose of receiving the objects 14. For each holding device 20, on the carrier 12 of the apparatus 10 for receiving the objects 14 there is one pivot bearing 32 and one further pivot bearing 38. The holding devices 20 are each mounted on the carrier 12 detachably in the pivot bearing 32 and so as to be able to rotate in the further pivot bearing 38.

The objects 14 secured in the holding devices 20 are located in the apparatus 10 on the spherical cap 13 of the carrier 12, i.e., on the surface of a sphere in the center of which, in the vacuum coating installation 5, the evaporator 22 is arranged. This has the effect that respective layers with the same layer thicknesses are applied to the objects 14 to be coated in the vacuum coating installation 5.

Figure 2:
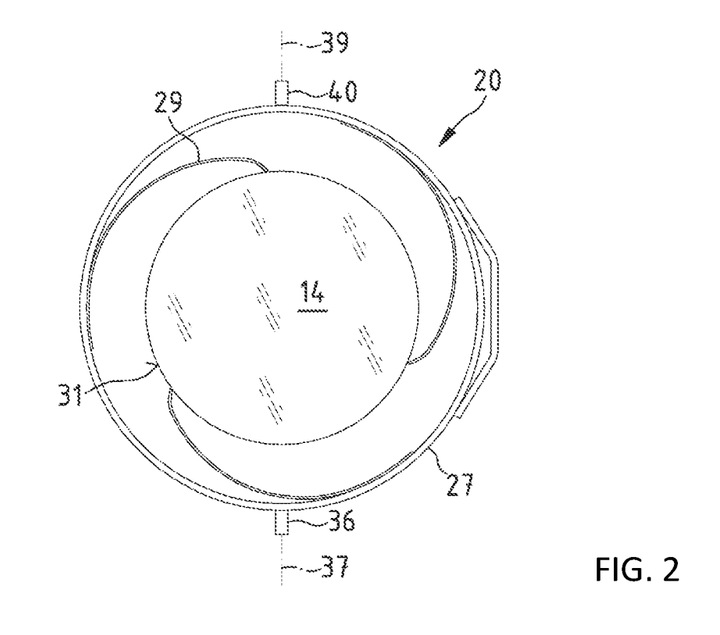
FIG. 2 shows a holding device of the apparatus.
Figure 3:
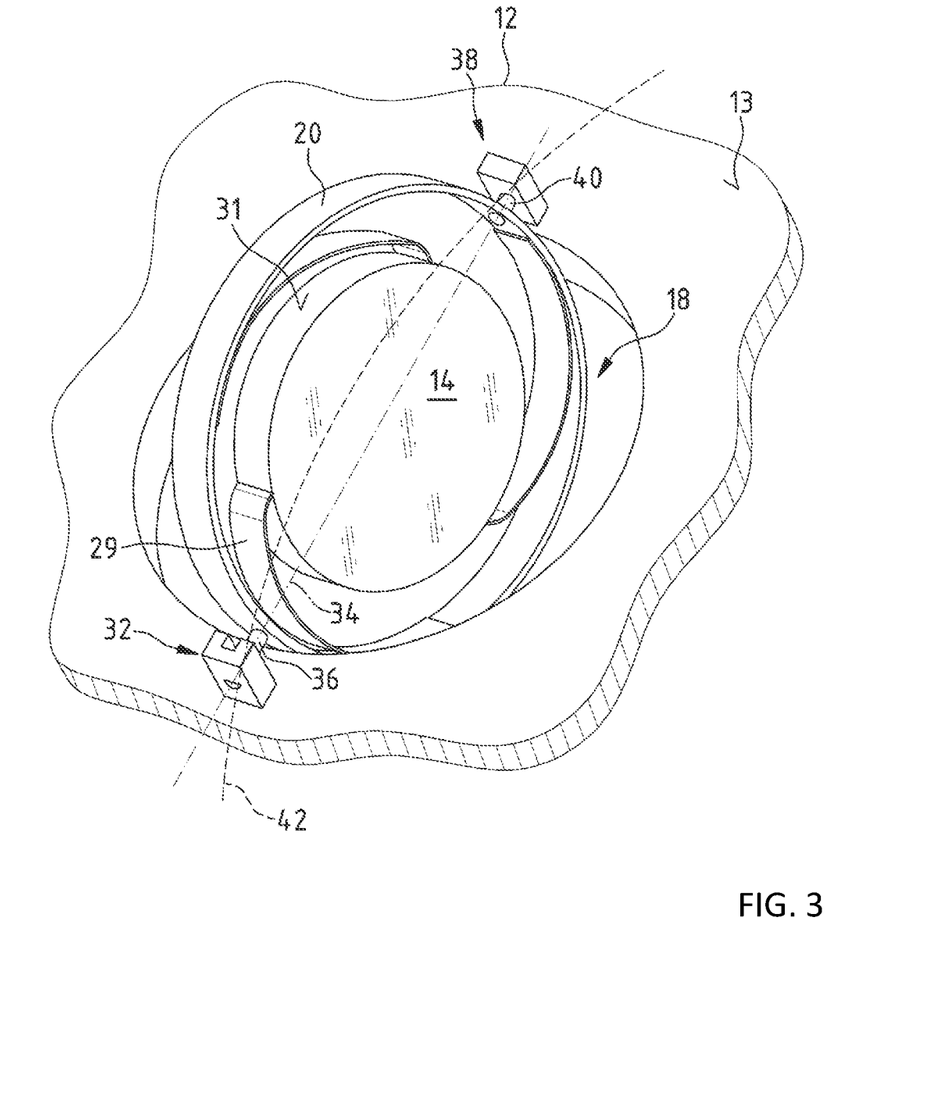
FIG. 3 shows a portion of a carrier of the apparatus for receiving objects, having a coating opening.

FIG. 2 shows a holding device 20 of the apparatus 10. FIG. 3 illustrates a portion of the carrier 12 with a coating opening 18 and with a holding device 20. The holding device 20 has a turning ring 27 to which spring lamellae 29 are attached, which hold a spectacle lens element, in the form of an object 14 to be coated, at a lateral edge face 31 by means of spring force.

A round body 36 with a round body axis 37 and a further round body 40 with a further round body axis 39 are attached to the turning ring 27. The round body axis 37 and the further round body axis 39 of the round bodies 36, 40 of the turning ring 27 are coaxial with one another. The round bodies 36, 40 attached to the turning ring 27 have the form of a pin. The round body 36 is arranged e.g., at a distance of 96 mm from the further round body 40.

The pivot bearing 32 and the further pivot bearing 38 for a holding device 20 in the apparatus 10 define a pivot axis 34. They lie on a meridian 42 of the spherical cap 13. The pivot bearing 32 is closer to the equator 21 of the spherical cap 13 and is thus deeper than the further pivot bearing 38. The inherent weight of the holding device 20 counteracts a movement of the round body 36 out of the bearing body of the pivot bearing 32. The holding device 20, comprising an object 14 held therein, may be turned in the apparatus 10 by rotation about the pivot axis 34, wherein the turning ring 27 dips into the coating opening 18. This makes it possible to be able to coat opposite surfaces of the objects 14 in the vacuum coating installation 5. The circumferentially closed receptacle 46 of the pivot bearing 32 and the circumferentially closed receptacle 46 of the further pivot bearing 38 are arranged e.g., at a distance of 90 mm from one another. The circumferentially open receptacle 48 of the pivot bearing 32 and the circumferentially closed receptacle 46 of the further pivot bearing 38 are arranged e.g., at a distance of 87.7 mm from one another.

Figure 4:
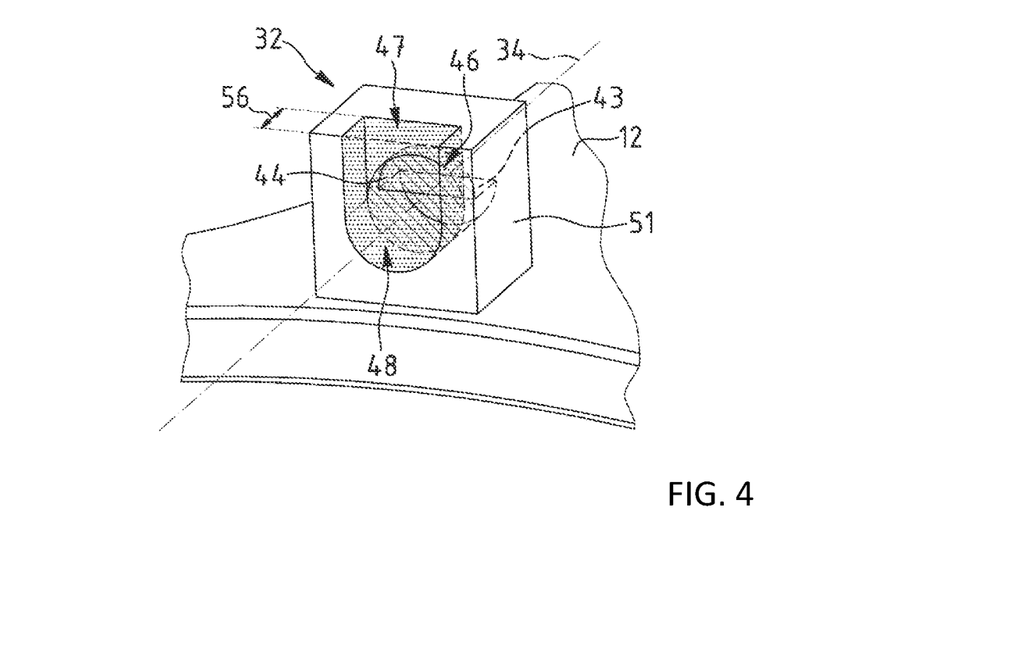
FIG. 4 shows a bearing body of a pivot bearing of the apparatus for receiving objects.

FIG. 4 shows the bearing body 51 of the pivot bearing 32. The bearing body 53 of the further pivot bearing 38 can be seen in FIG. 5. The bearing body 51 of the pivot bearing 32 is produced from a solid material. It is secured to the carrier 12 and has a circumferentially closed receptacle 46 and a circumferentially open receptacle 48 with a depth indicated by the double-headed arrow 56, to which depth the round body 36 or the further round body 40 can be inserted. The circumferentially open receptacle 48 in the bearing body 51 of the pivot bearing 32 merges with the circumferentially closed receptacle 46 of the bearing body 51 in this case. The circumferentially open receptacle 48 has a U-shape and has an oversize in relation to the round body 36 and the further round body 40. The circumferentially open receptacle 48 of the bearing body 51 has an opening 47 arranged on a side of the bearing body 51 that faces away from the carrier 12. The circumferentially closed receptacle 46 in the pivot bearing 32 has a stop 44, which prevents movement of the round body 36 or of the further round body 40 when the round bodies 36, 40 butt against the stop 44 by way of their end faces. The bearing body 51 of the pivot bearing 32, on a side facing away from the circumferentially open receptacle 48, has an aperture with an opening 43, which communicates with the circumferentially closed receptacle 46 and makes it possible to thoroughly rinse the circumferentially open receptacle 48 and the circumferentially closed receptacle 46 for cleaning purposes.

Figure 5:
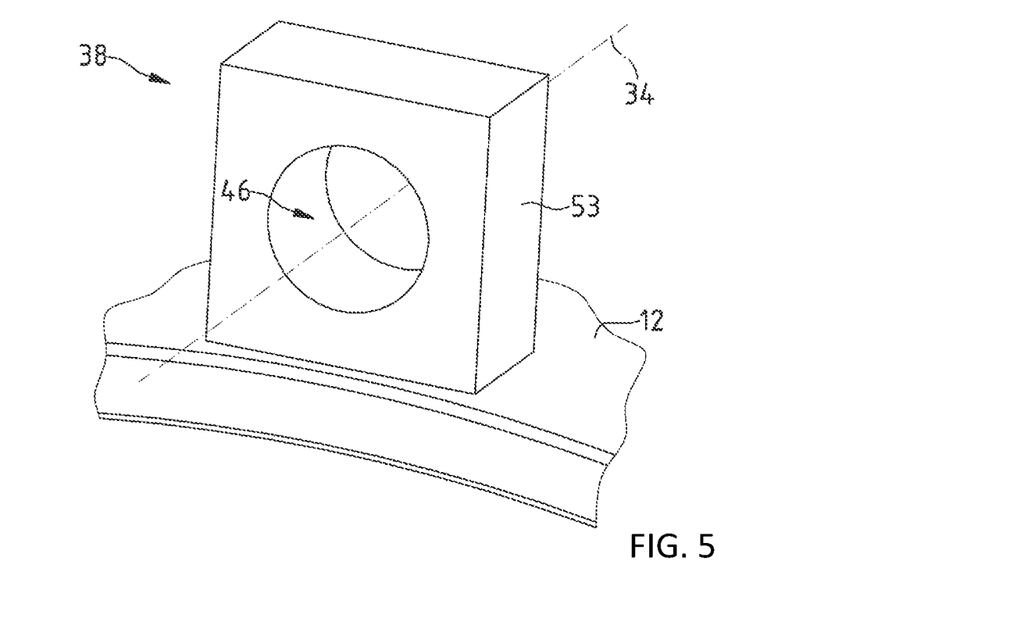
FIG. 5 shows a bearing body of a further pivot bearing of the apparatus for receiving objects.

The further pivot bearing 38 has a bearing body 53 which is secured to the carrier 12 and has a circumferentially closed receptacle 46 for the round body 36 or the further round body 40, which circumferentially closed receptacle is in the form of a through-bore in the bearing body 53.

The circumferentially closed receptacles 46 of the pivot bearing 32 and of the further pivot bearing 38 define the pivot axis 34 for the holding device 20. The holding device 20 is displaceable in the pivot bearing 32 and in the further pivot bearing 38 in the direction of the pivot axis 34.

Figure 6:
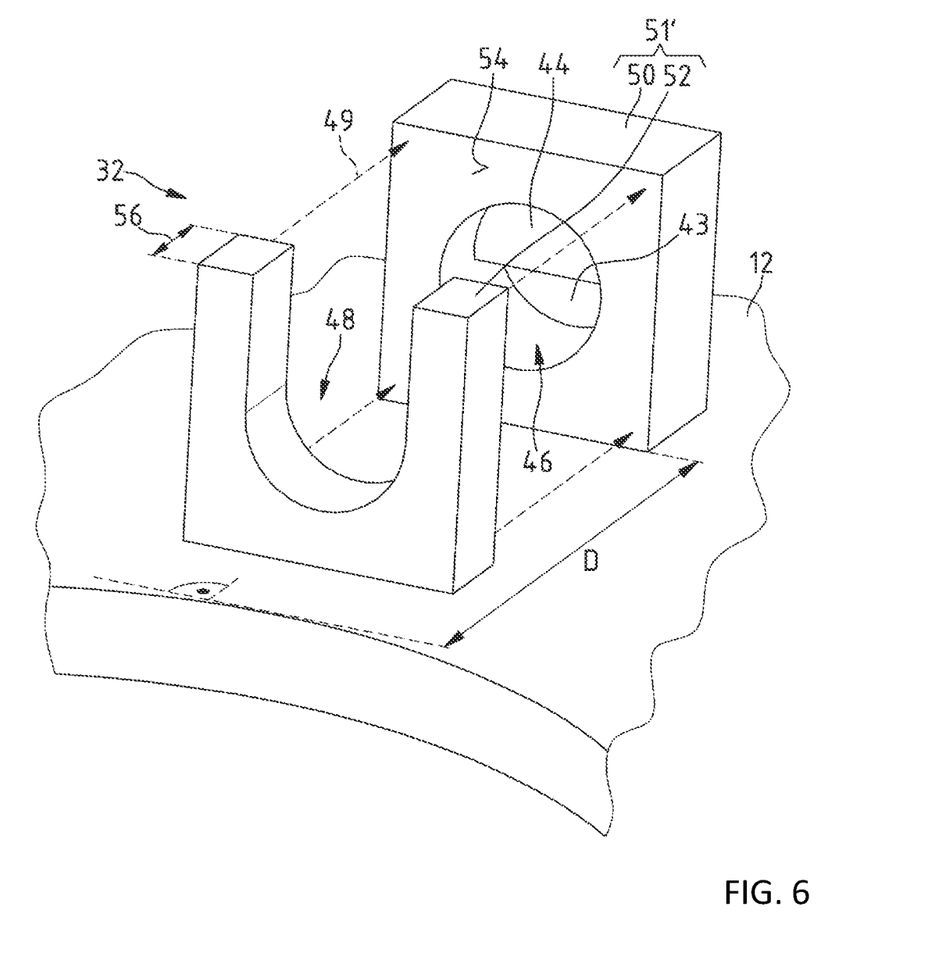
FIG. 6 shows an alternative bearing body of the pivot bearing to the bearing body of FIG. 4.

FIG. 6 shows an alternative bearing body 51' for the pivot bearing 32 to the bearing body 51, shown in FIG. 4, of the pivot bearing 32. This bearing body 51' has a first bearing body portion body 50 which is produced from a solid material and in which the circumferentially closed receptacle 46 is formed. A further bearing body portion body 52, which is likewise produced from a solid material, is attached to the first bearing body portion body 50 at a joining surface 54 of the first bearing body portion body 50, as indicated by the arrows 49. Here, the circumferentially open receptacle 48 is formed in the further bearing body portion body 52.

In the present case, the further bearing body portion body 52 is fixedly adhesively bonded to the first bearing body portion body 50. It should be noted that the first bearing body portion body 50 and the further bearing body portion body 52 may also be connected by welding or soldering. As an alternative, the further bearing body portion body 52 may also be a body arranged spaced apart from the first bearing body portion body 50. The extent, indicated by the double-headed arrow 56, of the further bearing body portion body 52 may amount to between 50% and 100% of the distance D between the first bearing body portion body 50 and the coating opening 18.

Figure 7:
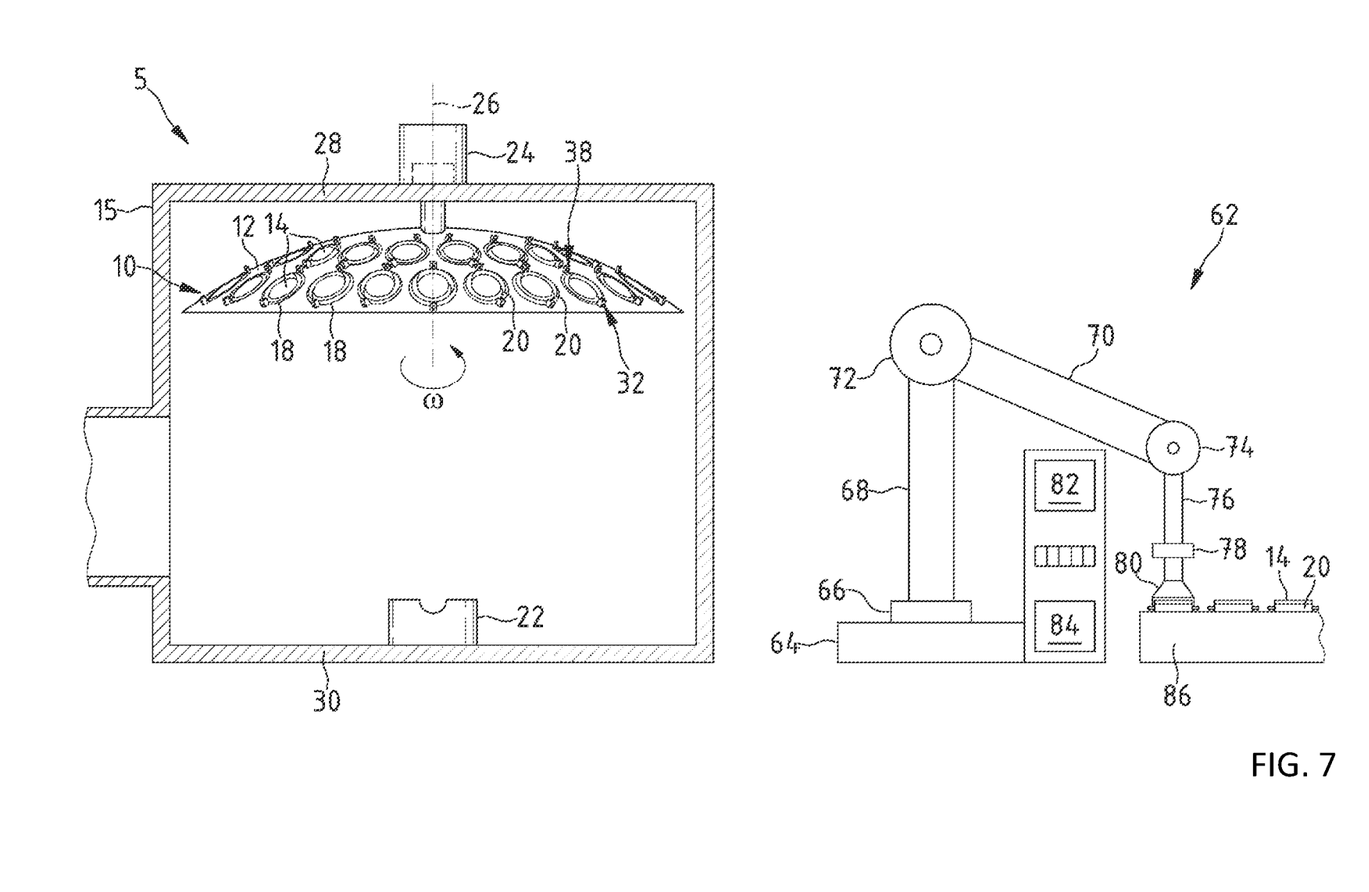
FIG. 7 shows the vacuum coating installation with a handling apparatus in a first position.

FIG. 7 shows the vacuum coating installation 5 comprising a handling apparatus 62, which serves to automatically arrange a holding device 20, comprising an object 14 held therein, in the pivot bearing 32 and in the further pivot bearing 38 at a coating opening 18 of the carrier 12 of the apparatus 10.

The handling apparatus 62 has a base 64 comprising a rotary joint 66 for a first robot arm 68, on which a second robot arm 70 is received in a pivot joint 72. In a further pivot joint 74, the second robot arm 70 bears a third robot arm 76, which comprises a rotary joint 78 to which a gripping tool 80 for gripping the holding device 20, comprising an object 14 held therein, is attached. The handling apparatus 62 comprises a computer unit 82 and a control unit 84. The computer unit 82 contains a computer program that generates control commands for the control unit 84, in order to receive a holding device 20, which is fed by means of a feed system 86 and comprises an object 14 received therein, in a holding device receiving position.

Figure 8:
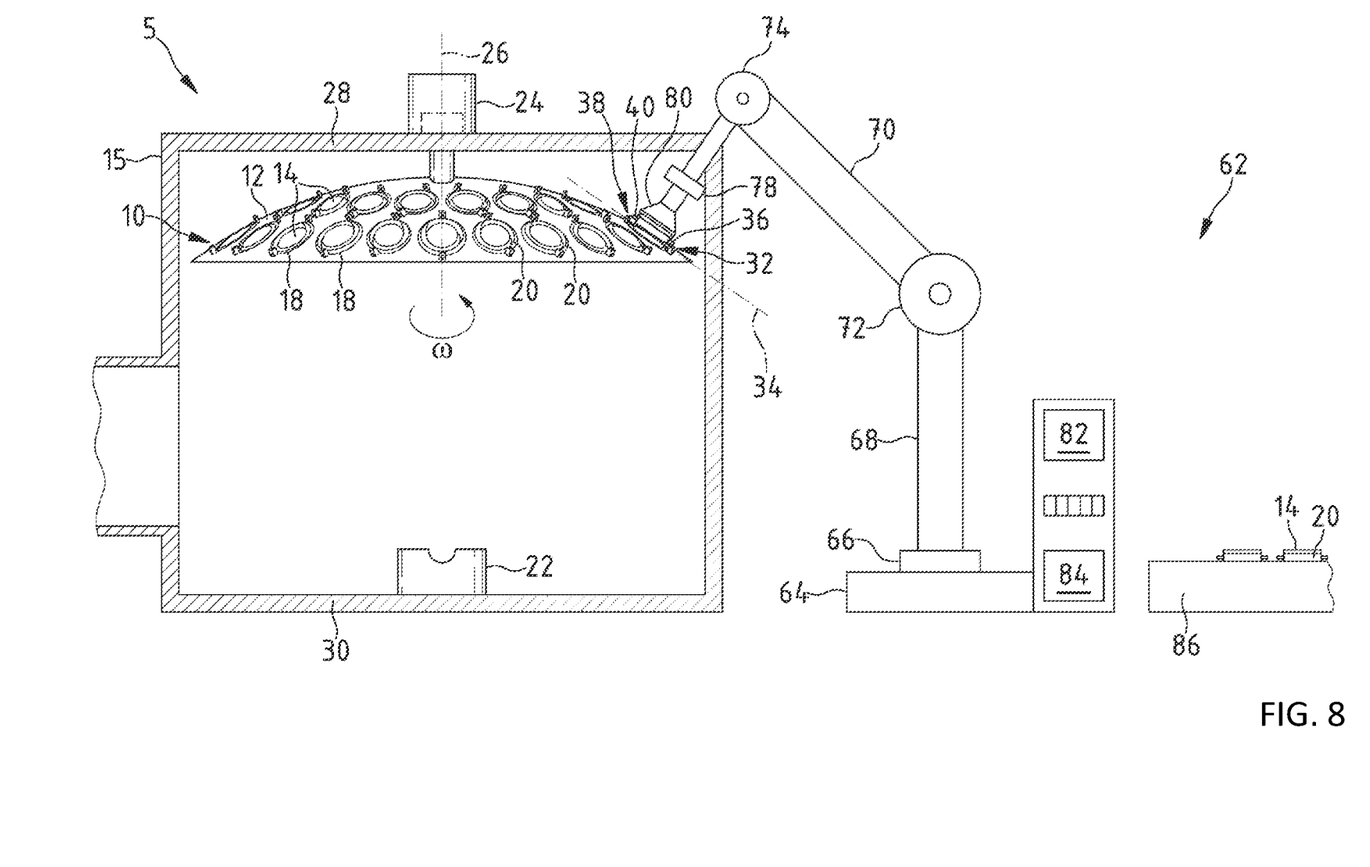
FIG. 8 shows the vacuum coating installation with the handling apparatus in a further position.

FIG. 8 shows the vacuum coating installation 5 comprising the handling apparatus 62 in a holding device insertion position. Here, in a first step, the gripping tool 80, comprising the holding device 20 held therein, is moved such that the further round body 40 attached to the turning ring 27 is inserted into the circumferentially closed receptacle 46 of the further pivot bearing 38. In a further step, following the first step, the round body 36 is then pivoted into the circumferentially open receptacle 48 of the pivot bearing 32 and then moved into its circumferentially closed receptacle 46 in the direction of the pivot axis 34.

In summary, the following should be noted: An apparatus 10 for receiving an object 14 in a vacuum coating installation 5 contains a carrier 12 which has a coating opening 18, and has a holding device 20 for holding the object 14 in the coating opening 18. In the apparatus 10 there is a pivot bearing 32 for the holding device 20, which pivot bearing is secured to the carrier 12, has a pivot axis 34 about which the holding device 20 can be pivoted for turning the object 14 that it holds in the coating opening 18, and has a bearing body 51, 51' with a circumferentially closed receptacle 46 for a round body 36 with an extent in the direction of the pivot axis 34. The bearing body 51, 51' has a circumferentially closed receptacle 46 and a circumferentially open receptacle 48 for the round body 36, with the result that the round body 36 can be inserted into the circumferentially closed receptacle 46 through the circumferentially open receptacle 48 when the holding device 20 is being arranged on the carrier 12.

The foregoing description of the exemplary embodiments of the disclosure illustrates and describes the present invention. Additionally, the disclosure shows and describes only the exemplary embodiments but, as mentioned above, it is to be understood that the disclosure is capable of use in various other combinations, modifications, and environments and is capable of changes or modifications within the scope of the concept as expressed herein, commensurate with the above teachings and/or the skill or knowledge of the relevant art.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

All publications, patents and patent applications cited in this specification are herein incorporated by reference, and for any and all purposes, as if each individual publication, patent or patent application were specifically and individually indicated to be incorporated by reference. In the case of inconsistencies, the present disclosure will prevail.

LIST OF REFERENCE SIGNS

5 Vacuum coating installation
10 Apparatus
12 Carrier
13 Spherical cap
14 Object
15 Housing
16 Vacuum chamber
17 Wall
18 Coating opening
20 Holding device
21 Equator
22 Evaporator
23 Shaft body
24 Drive module
25 Spherical cap center
26 Axis of rotation
27 Turning ring
28 Cover
29 Spring lamellae
30 Bottom
31 Peripheral surface
32 Pivot bearing
34 Pivot axis
36 Round body
37 Round body axis
38 Further pivot bearing
39 Further round body axis
40 Further round body
42 Meridian
43 Opening
44 Stop
45 Rotary bearing
46 Circumferentially closed receptacle
47 Opening
48 Circumferentially open receptacle
49 Arrows
50 First bearing body portion body
51, 51' Bearing body
52 Further bearing body portion body
53 Further bearing body
54 Joining surface
56 Double-headed arrow
62 Handling apparatus
64 Base
66 Rotary joint
68 First robot arm
70 Second robot arm
72 Pivot joint
74 Further pivot joint
76 Third robot arm
78 Rotary joint
80 Gripping tool
82 Computer unit
84 Control unit
86 Feed system
R Spherical cap radius
D Distance

The invention claimed is:

1. An apparatus for receiving an object in a vacuum-coating installation, the apparatus comprising:
a carrier having a coating opening;
a holding device configured to hold the object in the coating opening; and
a pivot bearing for the holding device, the pivot bearing being secured to the carrier, the pivot bearing having a pivot axis about which the holding device can be pivoted to turn the object held in the coating opening, and the pivot bearing having a bearing body with a circumferentially closed receptacle for a round body with an extent in a direction of the pivot axis,
wherein the bearing body additionally has a circumferentially open receptacle for the round body, and wherein the round body can be inserted into the circumferentially closed receptacle through the circumferentially open receptacle when the holding device is being arranged on the carrier.

2. The apparatus as claimed in claim 1, wherein the circumferentially closed receptacle of the bearing body merges into the circumferentially open receptacle of the bearing body.

3. The apparatus as claimed in claim 1, wherein the bearing body is secured to the carrier, and/or p1 wherein the circumferentially open receptacle of the bearing body is arranged between the coating opening of the carrier and the circumferentially closed receptacle of the bearing body, wherein an extent of the circumferentially open receptacle of the bearing body in the direction of the pivot axis amounts to at least 50% and at most 100% of a distance between the circumferentially closed receptacle of the bearing body and the coating opening, and/or
wherein the circumferentially open receptacle of the bearing body has an opening arranged on a side of the bearing body that faces away from the carrier, and/or
wherein the circumferentially open receptacle of the bearing body has a U-shape.

4. The apparatus as claimed in claim 1, wherein the round body is a mounting pin attached to the holding device.

5. The apparatus as claimed in claim 4, wherein the circumferentially closed receptacle has an oversize in relation to the round body.

6. The apparatus as claimed in claim 1, further comprising:
a further pivot bearing configured to mount the holding device on the carrier so as to be able to pivot about a pivot axis, which further pivot bearing serves for turning the object held by the holding device in the coating opening and has a further bearing body with a circumferentially closed receptacle for a further round body with an extent in the direction of the pivot axis.

7. The apparatus as claimed in claim 6, wherein the further bearing body has a circumferentially closed receptacle and a circumferentially open receptacle for the further round body, such that the further round body can be inserted into the circumferentially closed receptacle through the circumferentially open receptacle when the holding device is being arranged on the carrier, and/or wherein the further bearing body is secured to the carrier.

8. The apparatus as claimed in claim 6, wherein the further round body is a mounting pin attached to the holding device.

9. The apparatus as claimed in claim 8, wherein an end-face stop for the mounting pin is formed in the bearing body of the pivot bearing.

10. The apparatus as claimed in claim 6, wherein the pivot bearing and the further pivot bearing for mounting the holding device on the carrier so as to be able to pivot about a pivot axis lie on a meridian of a spherical cap, and/or wherein the holding device is arranged in the pivot bearing and in the further pivot bearing so as to be displaceable in the direction of the pivot axis.

11. The apparatus as claimed in claim 1, wherein the bearing body of the pivot bearing is produced from a solid material, or wherein the bearing body of the pivot bearing has a first bearing body portion body, which is produced from a solid material and in which the circumferentially closed receptacle is formed, and a further bearing body portion body, which is produced from a solid material, in which the circumferentially open receptacle is formed, and which is attached to a joining surface of the first bearing body portion body or is spaced apart from the first bearing body portion body.

12. A method for arranging a holding device, having an object secured therein, for the purpose of being coated in a vacuum coating installation, on a carrier having a coating opening and having a bearing body, which is secured to the carrier or the holding device and has a circumferentially closed receptacle for a round body that has an extent in a direction of a pivot axis and is secured to the holding device or to the carrier, wherein the bearing body additionally has a circumferentially open receptacle for the round body, and in which method, by relatively displacing the holding device with respect to the carrier, the round body is inserted into the circumferentially open receptacle and thereafter moved into the circumferentially closed receptacle.

13. A method for improving a finish of an object in a vacuum coating installation, the method comprising the following steps:

securing the object in a holding device;

arranging the holding device, having the object secured therein, for the purpose of being coated in a vacuum coating installation, on a carrier having a coating opening and having a bearing body, which is secured to the carrier or the holding device and has a circumferentially closed receptacle for a round body that has an extent in a direction of a pivot axis and is secured to the holding device or to the carrier; and coating the object in the vacuum coating installation, wherein the bearing body additionally has a circumferentially open receptacle for the round body, and wherein the holding device is arranged on the carrier by the method specified in claim 12.

* * * * *